(12) United States Patent
Hori

(10) Patent No.: US 12,732,156 B2
(45) Date of Patent: Sep. 8, 2026

(54) COMPOSITE SUBSTRATE AND METHOD OF PRODUCING COMPOSITE SUBSTRATE

(71) Applicant: NGK Insulators, Ltd., Nagoya-City (JP)

(72) Inventor: Yuji Hori, Owariasahi-City (JP)

(73) Assignee: NGK INSULATORS, LTD., Nagoya-City (JP)

( * ) Notice: Subject to any disclaimer, the term of this patent is extended or adjusted under 35 U.S.C. 154(b) by 1063 days.

(21) Appl. No.: 17/818,074

(22) Filed: Aug. 8, 2022

(65) Prior Publication Data

US 2022/0399873 A1 Dec. 15, 2022

Related U.S. Application Data

(63) Continuation of application No. PCT/JP2022/000889, filed on Jan. 13, 2022.

(30) Foreign Application Priority Data

Jun. 9, 2021 (JP) ................................ 2021-096834

(51) Int. Cl.
*H03H 9/02* (2006.01)
*H10N 30/092* (2023.01)

(52) U.S. Cl.
CPC ...... *H03H 9/02574* (2013.01); *H10N 30/092* (2023.02)

(58) Field of Classification Search
CPC ........................ H03H 9/02574; H10N 30/092
USPC ........................................................ 310/311
See application file for complete search history.

(56) References Cited

U.S. PATENT DOCUMENTS

| | | | |
|---|---|---|---|
| 11,504,958 | B2 | 11/2022 | Le Rhun et al. |
| 2004/0226162 | A1 | 11/2004 | Miura et al. |
| 2005/0128255 | A1 | 6/2005 | Nakanishi |
| 2013/0334932 | A1 | 12/2013 | Maruyama et al. |
| 2019/0280666 | A1 | 9/2019 | Akiyama et al. |
| 2021/0067129 | A1 | 3/2021 | Hori et al. |
| 2021/0067130 | A1 | 3/2021 | Hori et al. |
| 2021/0260859 | A1 | 8/2021 | Le Rhun et al. |

FOREIGN PATENT DOCUMENTS

| | | | |
|---|---|---|---|
| JP | 2004-343359 | A | 12/2004 |
| JP | 2017-069731 | A | 4/2017 |
| JP | 2018-014606 | A | 1/2018 |
| JP | 2018-207371 | A | 12/2018 |
| WO | 2011/158636 | A1 | 12/2011 |
| WO | 2019/220721 | A1 | 11/2019 |
| WO | 2019/243744 | A1 | 12/2019 |
| WO | 2020/189115 | A1 | 9/2020 |

OTHER PUBLICATIONS

Machine translation of WO 2019/220721, Hori, Nov. 21, 2019 (Year: 2019).*

(Continued)

*Primary Examiner* — Bumsuk Won
(74) *Attorney, Agent, or Firm* — Muncy, Geissler, Olds & Lowe, P.C.

(57) ABSTRACT

A composite substrate includes in this order: a support substrate; an intermediate layer; and a piezoelectric layer, wherein the intermediate layer contains bubbles.

12 Claims, 3 Drawing Sheets

(56) References Cited

OTHER PUBLICATIONS

Japanese Office Action (with English translation) dated Jul. 25, 2023 (Application No. 2022-527936).
Extended European Search Report (Application No. 22741412.5) dated Jan. 22, 2024 (10 pages).
English translation of the International Preliminary Report on Patentability (Chapter I) dated Aug. 29, 2022 (Application No. PCT/JP2022/000889).
International Search Report and Written Opinion (Application No. PCT/JP2022/000889) dated Mar. 22, 2022.

* cited by examiner

COMPOSITE SUBSTRATE AND METHOD OF PRODUCING COMPOSITE SUBSTRATE

CROSS-REFERENCE TO RELATED APPLICATIONS

This application is a continuation under 35 U.S.C. 120 of International Application PCT/JP2022/000889 having the International Filing Date of Jan. 13, 2022, and having the benefit of the earlier filing date of Japanese Application No. 2021-096834, filed on Jun. 9, 2021. Each of the identified applications is fully incorporated herein by reference.

BACKGROUND OF THE INVENTION

Technical Field

The present invention relates to a composite substrate and a method of producing a composite substrate.

Background Art

For example, a filter utilizing a surface acoustic wave (SAW filter) has been used in a communication device such as a cellular phone for extracting an electric signal having any appropriate frequency. A composite substrate including a piezoelectric layer and a support substrate has been used in the SAW filter. In such composite substrate, a problem in that a spurious occurs in a high-frequency region owing to, for example, the reflection of an elastic wave occurring between the piezoelectric layer and the support substrate has been known.

To cope with the above-mentioned problem of the spurious, as disclosed in, for example, Patent Literature 1, there has been proposed the formation of an uneven structure on at least one of a piezoelectric substrate or a support substrate for forming a composite substrate. However, a further improvement has been desired for the above-mentioned problem of the spurious.

CITATION LIST

Patent Literature

[PTL 1] JP 2018-14606 A

SUMMARY OF THE INVENTION

A primary object of the present invention is to provide a composite substrate that can suppress the occurrence of a spurious.

According to one embodiment of the present invention, there is provided a composite substrate, including in this order: a support substrate; an intermediate layer; and a piezoelectric layer, wherein the intermediate layer contains bubbles.

In one embodiment, the intermediate layer contains silicon oxide.

In one embodiment, the intermediate layer has a thickness of 500 nm or more and 1,000 nm or less.

In one embodiment, the intermediate layer has a first region in which the bubbles are absent, and the first region is formed in a range of 200 nm or less from an interface on a side of the support substrate.

In one embodiment, the intermediate layer has a third region in which the bubbles are absent, and the third region is formed in a range of 200 nm or less from an interface on a side of the piezoelectric layer.

In one embodiment, the bubbles each have a bubble diameter of from 10 nm to 100 nm.

In one embodiment, the piezoelectric layer has a thickness of 5 μm or less.

According to another embodiment of the present invention, there is provided a surface acoustic wave element, including the above-mentioned composite substrate.

According to still another embodiment of the present invention, there is provided a method of producing a composite substrate, including: forming a first layer on one side of a support substrate; forming a second layer on one side of a piezoelectric substrate; joining the first layer and the second layer to provide a joined layer; and forming bubbles in the joined layer to provide an intermediate layer.

In one embodiment, at a time of the joining, a joining surface of the first layer and a joining surface of the second layer are subjected to activation treatment.

In one embodiment, the joining surfaces are hydrophilized by the activation treatment.

In one embodiment, the activation treatment is performed by plasma irradiation.

In one embodiment, the forming the bubbles is performed by heating the joined layer.

In one embodiment, the heating includes heating the joined layer at a rate of temperature increase of 0.7° C./min or less until a heating temperature reaches from 100° C. to 150° C.

In one embodiment, the heating includes heating the joined layer at 180° C. or more.

Advantageous Effects of Invention

According to the embodiment of the present invention, the arrangement of the intermediate layer containing the bubbles between the piezoelectric layer and the support substrate can suppress the occurrence of a spurious.

DETAILED DESCRIPTION OF THE INVENTION

Embodiments of the present invention are described below with reference to the drawings. However, the present invention is not limited to those embodiments. In addition, the drawings may be schematically illustrated in terms of, for example, the width, thickness, and shape of each portion as compared to the embodiments for further making the description clear. However, the drawings are merely examples, and do not limit the interpretation of the present invention.

A. Composite Substrate

Figure 1:
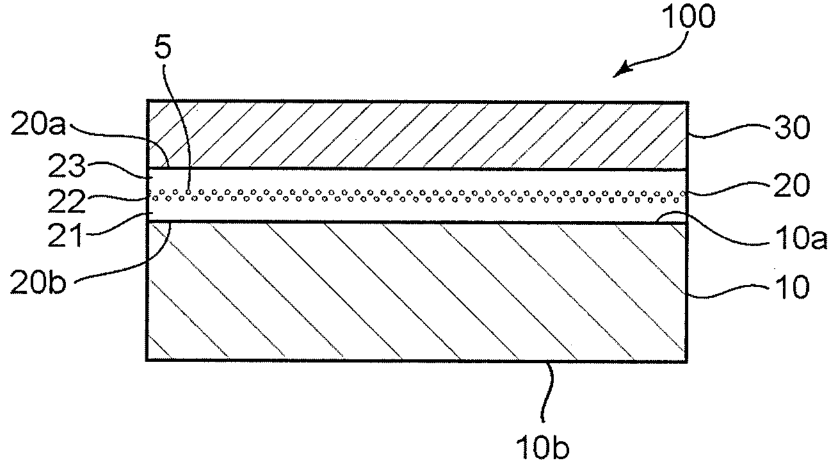
FIG. 1 is a schematic sectional view for illustrating the schematic configuration of a composite substrate according to one embodiment of the present invention.

FIG. 1 is a schematic sectional view for illustrating the schematic configuration of a composite substrate according to one embodiment of the present invention. A composite substrate 100 includes a support substrate 10, an intermediate layer 20, and a piezoelectric layer 30 in the stated order. Specifically, the piezoelectric layer 30 is arranged on the first main surface 10*a* side of the support substrate 10 having the first main surface 10*a* and a second main surface 10*b* facing each other, and the intermediate layer 20 is arranged between the support substrate 10 and the piezoelectric layer 30.

The intermediate layer 20 has formed therein bubbles 5. The arrangement of such intermediate layer can suppress the occurrence of a spurious. In the illustrated example, in the intermediate layer 20, a first region 21 in which the bubbles are substantially absent, a second region 22 in which the bubbles are present, and a third region 23 in which the bubbles are substantially absent are formed in the stated order from the support substrate 10 side (from the lower side of FIG. 1). In FIG. 1, the hatching of a section of the intermediate layer is omitted for ease of viewing of the drawing.

The bubbles may be present in the entirety of the intermediate layer, or may be unevenly distributed therein. In the example illustrated in FIG. 1, the bubbles 5 are unevenly distributed in the intermediate layer 20, and are formed inside the intermediate layer 20 along its surface direction. Specifically, the bubble-less region 23 is formed in the end portion of the intermediate layer 20 on the piezoelectric layer 30 side. For example, the bubble-less region 23 may be formed in the range of from 0 nm or more to 200 nm or less from an interface 20*a* on the piezoelectric layer 30 side, or may be formed in the range of from 20 nm or more to 100 nm or less from the interface 20*a* on the piezoelectric layer 30 side. In addition, the bubble-less region 21 is formed in the end portion of the intermediate layer 20 on the support substrate 10 side. For example, the bubble-less region 21 may be formed in the range of from 0 nm or more to 200 nm or less from an interface 20*b* on the support substrate 10 side, or may be formed in the range of from 20 nm or more to 100 nm or less from the interface 20*b* on the support substrate 10 side.

The bubbles may each contain water. The diameter of each of the bubbles is, for example, from 10 nm to 100 nm, and may be from 20 nm to 60 nm. Herein, the bubble diameter means the long diameter of each of the bubbles. The bubble diameter may be identified by, for example, observation with a laser microscope.

The ratio of the bubbles in the intermediate layer is, for example, from 3% to 20%, preferably from 7% to 15%. The ratio of the bubbles in the intermediate layer may be determined by, for example, observing a section of the intermediate layer with a scanning electron microscope (SEM) and subjecting the resultant image to image analysis treatment.

The composite substrate 100 may further include any appropriate layer (not shown). The kinds, functions, number, combination, arrangement, and the like of such layers may be appropriately set in accordance with purposes.

The composite substrate 100 may be produced in any appropriate shape. In one embodiment, the substrate may be produced in the form of a so-called wafer. The size of the composite substrate 100 may be appropriately set in accordance with purposes. The diameter of the wafer is, for example, from 100 mm to 200 mm.

A-1. Support Substrate

Any appropriate substrate may be used as the support substrate. The support substrate may include a single crystalline substance, may include a polycrystalline substance, or may include a combination thereof. A material for forming the support substrate is preferably selected from: silicon; sapphire; glass; quartz; crystal; and alumina.

The silicon may be single crystalline silicon having a polycrystalline layer formed on its surface, or may be high-resistance silicon.

Typically, the sapphire is a single crystalline. substance having the composition of $Al_2O_3$, and the alumina is a polycrystalline substance having the composition of $Al_2O_3$. The alumina is preferably translucent alumina.

The thermal expansion coefficient of the material for forming the support substrate is preferably smaller than the thermal expansion coefficient of a material for forming a piezoelectric layer to be described later. Such support substrate can suppress changes in shape and size of the piezoelectric layer at the time of a temperature change, and hence can suppress, for example, a change in frequency characteristic of a surface acoustic wave element to be obtained.

Any appropriate thickness may be adopted as the thickness of the support substrate. The thickness of the support substrate is, for example, from 100 μm to 1,000 μm.

The arithmetic average roughness Ra of the first main surface of the support substrate is, for example, 0.1 nm or more and 1 nm or less, and may be 0.5 nm or less, or may be 0.3 nm or less. Such support substrate may provide, for example, a surface acoustic wave element having high performance (e.g., having a high Q-value). The arithmetic average roughness Ra is a value measured with an atomic force microscope (AFM) in a field of view measuring 10 μm by 10 μm.

A-2. Intermediate Layer

For example, any appropriate material that can form bubbles may be used as a material for forming the intermediate layer. Silicon oxide ($SiO_x$) is preferably used as the material for forming the intermediate layer. A layer including silicon oxide may contain water molecules, and hence, for example, bubble formation to be described later may be satisfactorily performed therein. "x" in $SiO_x$ preferably satisfies a relationship of $1.95 \leq x \leq 2.05$. The content of silicon oxide in the intermediate layer is, for example, 97 wt % or more. The intermediate layer may contain a trace amount of any other component (impurity), such as F or Ar.

The thickness of the intermediate layer is preferably 200 nm or more, more preferably 300 nm or more, still more preferably 500 nm or more. Such thickness enables, for example, satisfactory formation of the bubbles. Meanwhile, the thickness of the intermediate layer is preferably 2,000 nm or less, more preferably 1,500 nm or less, still more preferably 1,000 nm or less.

The intermediate layer may be formed by any appropriate method. The layer may be formed by, for example, physical vapor deposition, such as sputtering or ion beam-assisted deposition (IAD), chemical vapor deposition, or an atomic layer deposition (ALD) method.

A-3. Piezoelectric Layer

Any appropriate piezoelectric material may be used as the material for forming the piezoelectric layer. A single crystal having the composition of $LiAO_3$ is preferably used as the piezoelectric material. Herein, A represents one or more kinds of elements selected from: niobium; and tantalum. Specifically, $LiAO_3$ may be lithium niobate ($LiNbO_3$), lithium tantalate ($LiTaO_3$), or a lithium niobate-lithium tantalate solid solution.

In the case where the piezoelectric material is lithium tantalate, for example, when the X-axis (crystal axis) of the piezoelectric material is defined as the direction ($X_1$) in which a surface acoustic wave propagates, it is preferred that the direction toward which the piezoelectric layer faces when rotated from the Y-axis thereof toward the Z-axis thereof by from 32° to 55° (e.g., 42°) correspond to a direction ($X_3$) perpendicular to the main surface of the piezoelectric layer, specifically, be (180°, 58° to 35°, 180°) in Euler angle notation.

In the case where the piezoelectric material is lithium niobate, for example, when the X-axis (crystal axis) of the piezoelectric material is defined as the direction ($X_1$) in which a surface acoustic wave propagates, it is preferred that the direction toward which the piezoelectric layer faces when rotated from the Z-axis thereof toward the −Y-axis thereof by from 0° to 40° (e.g., 37.8°) correspond to a direction ($X_3$) perpendicular to the main surface of the piezoelectric layer, specifically, be (0°, 0° to 40°, 0°) in Euler angle notation. In addition, in the case where the piezoelectric material is lithium niobate, for example, when the X-axis (crystal axis) of the piezoelectric material is defined as the direction ($X_1$) in which a surface acoustic wave propagates, it is preferred that the direction toward which the piezoelectric layer faces when rotated from the Y-axis thereof toward the Z-axis thereof by from 40° to 65° correspond to a direction ($X_3$) perpendicular to the main surface of the piezoelectric layer, specifically, be (180°, 50° to 25°, 180°) in Euler angle notation.

The thickness of the piezoelectric layer is, for example, 10 μm or less, preferably 5 μm or less, more preferably 3 μm or less. Such thickness may provide, for example, a surface acoustic wave element having high performance (e.g., having a satisfactory temperature characteristic or a high Q-value). When the bubbles are formed in the intermediate layer, the piezoelectric layer may be designed to be thin as compared to, for example, a mode in which the bubbles are formed in the piezoelectric layer. Meanwhile, the thickness of the piezoelectric layer is, for example, 0.2 μm or more.

The arithmetic average roughness Ra of the surface of the piezoelectric layer on the side on which the support substrate (intermediate layer) is arranged is, for example, 0.1 nm or more and 1 nm or less, and may be 0.5 nm or less, or may be 0.3 nm or less. Such piezoelectric layer may provide, for example, a surface acoustic wave element having high performance (e.g., having a satisfactory temperature characteristic or a high Q-value).

A-4. Production Method

A method of producing a composite substrate according to one embodiment of the present invention includes: forming a first layer on one side of a support substrate; forming a second layer on one side of a piezoelectric substrate; joining the first layer and the second layer to provide a joined layer; and forming bubbles in the joined layer to provide an intermediate layer.

Figure 2A:
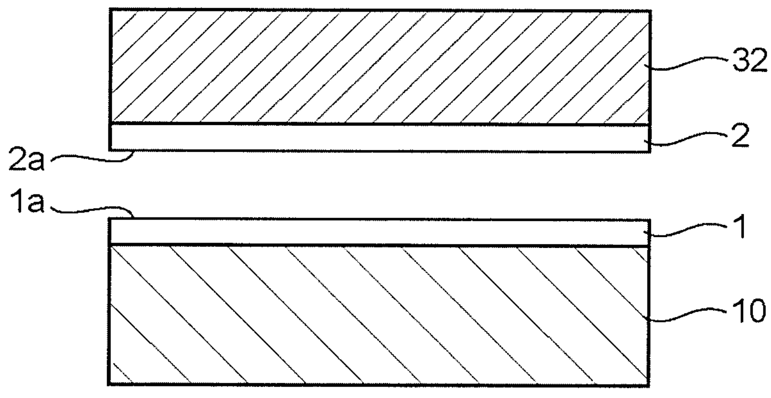
FIG. 2A is a view for illustrating an example of a production process for the composite substrate according to one embodiment of the present invention.
Figure 2B:
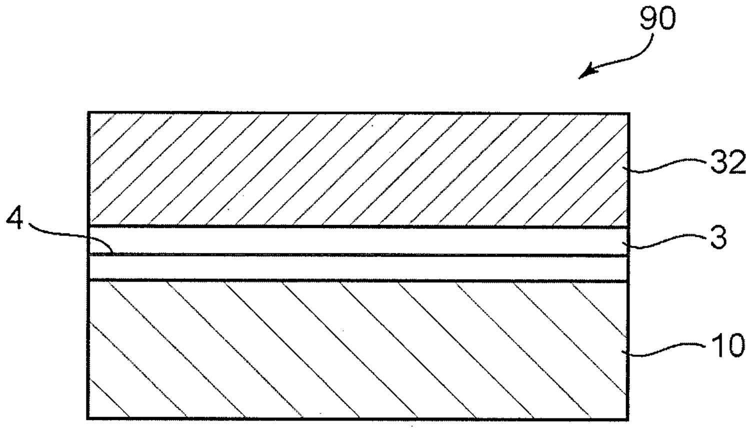
FIG. 2B is a view subsequent to FIG. 2A.
Figure 2C:
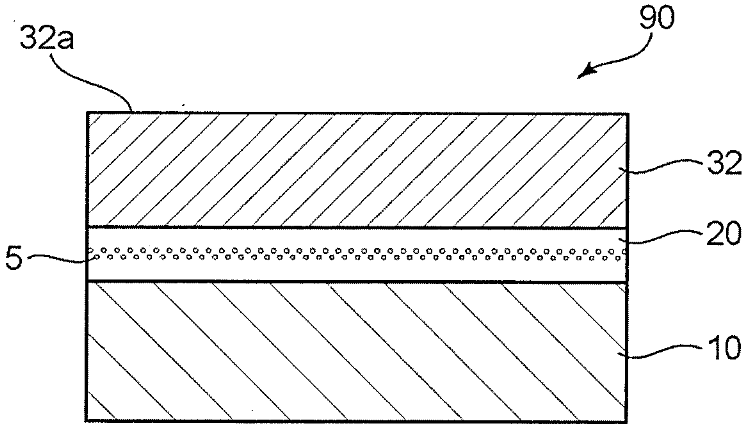
FIG. 2C is a view subsequent to FIG. 2B.

FIG. 2A to FIG. 2C are views for illustrating an example of a production process for the composite substrate according to one embodiment.

FIG. 2A is an illustration of a state in which a first layer 1 is formed on one side of the support substrate 10 and a second layer 2 is formed on one side of a piezoelectric substrate 32. The first layer 1 and the second layer 2 may each be formed by the above-mentioned method of forming the intermediate layer. In one embodiment, a material for forming the first layer 1 and a material for forming the second layer 2 are substantially identical to each other. For example, the first layer 1 and the second layer 2 are formed by performing sputtering with the same target (e.g., a Si target) under the same conditions. Any appropriate material may be selected as each of the material for forming the first layer 1 and the material for forming the second layer 2 as long as joining to be described later may be performed.

The thickness of each of the first layer 1 and the second layer 2 is, for example, 100 nm or more and 1,000 nm or less, preferably 250 nm or more and 500 nm or less. The thickness of the first layer 1 and the thickness of the second layer 2 may be set in accordance with, for example, desired positions at which the bubbles are formed. The ratio of the thickness of the second layer 2 to the thickness of the first layer 1 is, for example, from 0.1 to 2.0, preferably from 0.3 to 1.7.

FIG. 2B is an illustration of a state in which the surface 1*a* of the first layer 1 formed on the support substrate 10 and the surface 2*a* of the second layer 2 formed on the piezoelectric substrate 32 are superimposed on each other to preliminarily join the support substrate 10 and the piezoelectric substrate 32. The preliminary joining provides a joined layer 3 (joined body 90) in which the first layer 1 and the second layer 2 are joined. At the time of the preliminary joining, the joining surfaces 1*a* and 2*a* are preferably activated by any appropriate activation treatment. The performance of the activation treatment can improve adhesiveness between the joining surface 1*a* and the joining surface 2*a*.

The joining surfaces 1*a* and 2*a* are preferably hydrophilized by the activation treatment. For example, the joining surfaces 1*a* and 2*a* each preferably have a hydroxy group. In one embodiment, the joining surfaces 1*a* and 2*a* each have a silanol group. According to such state, when the joining surface 1*a* and the joining surface 2*a* are brought into contact with each other, a hydrogen bond may be formed between both the surfaces.

In one embodiment, the activation treatment is performed by plasma irradiation. A gas in an atmosphere at the time of the activation treatment is, for example, oxygen, nitrogen, hydrogen, or argon. Those gases may be used alone or in combination (as a mixed gas) thereof. Of those, oxygen or nitrogen is preferably used.

The pressure of the atmosphere at the time of the activation treatment by the plasma irradiation is preferably 100 Pa or less, more preferably 80 Pa or less. Meanwhile, the pressure of the atmosphere is preferably 30 Pa or more, more preferably 50 Pa or more.

A temperature at the time of the plasma irradiation is preferably 150° C. or less, more preferably 100° C. or less, still more preferably 50° C. or less. Such temperature may suppress, for example, the deterioration of the piezoelectric substrate due to the plasma irradiation.

Energy at the time of the plasma irradiation is preferably from 30 W to 150 W, more preferably from 60 W to 120 W. The time period of the plasma irradiation is preferably from 5 seconds to 15 seconds.

FIG. 2C is an illustration of a state in which the bubbles 5 are formed in the joined layer 3 to complete the formation of the intermediate layer 20. The bubbles 5 may be formed by, for example, heating the joined layer 3 (joined body 90). Specifically, the transformation of the hydrogen bond (e.g., Si—OH—OH—Si) into a covalent bond (e.g., Si—O—Si) may produce water molecules. The water molecules may diffuse a joining interface 4 between the first layer 1 and the second layer 2 to be discharged to the outside of the joined layer 3 (joined body 90). At that time, water may expand to form the bubbles. The heating can accelerate the production of the covalent bond, and the diffusion and expansion. In addition, the heating can improve joining strength between the first layer 1 and the second layer 2 (the support substrate 10 and the piezoelectric substrate 32). The strength may be improved to, for example, such strength that the joined body may resist processing, such as the grinding or polishing of the piezoelectric substrate to be described later.

For example, any appropriate conditions under which the bubbles may be formed are adopted as the conditions of the heating. The heating is typically performed under an inert gas atmosphere, such as nitrogen or argon. In one embodiment, the heating includes a first heating step and a second heating (annealing) step in the stated order. In the first heating step, the joined body 90 is heated until a heating temperature increases from room temperature to reach a temperature T1 (e.g., from 100° C. to 150° C.). The temperature increase to the temperature T1 is performed at a rate of temperature increase of preferably 0.7° C./min or less, more preferably 0.5° C./min or less. Such rate of temperature increase enables satisfactory formation of the bubbles. Meanwhile, the rate of temperature increase to the temperature T1 is, for example, 0.1° C./min or more.

In the second heating step, the joined body 90 is placed under the condition of a temperature T2 for a predetermined time period (e.g., from 3 hours to 25 hours). The second heating step (annealing) enables satisfactory formation of the bubbles, and can further improve the joining strength between the first layer 1 and the second layer 2 (the support substrate 10 and the piezoelectric substrate 32). The temperature T2 is, for example, 180° C. or more, and may be 200° C. or more, 230° C. or more, 250° C. or more, or 270° C. or more. Meanwhile, the temperature T2 is preferably 350° C. or less, more preferably 300° C. or less from the viewpoint of, for example, preventing the breakage of the joined body 90.

The conditions of the temperature increase from the temperature T1 to the temperature T2 may be set to any appropriate conditions. In addition, after the second heating step, the joined body 90 is typically naturally cooled.

After the formation of the intermediate layer 20, the surface (upper surfacer) **32*a* of the piezoelectric substrate 32 is typically subjected to processing, such as grinding or polishing, so that a piezoelectric layer having the above-mentioned desired thickness may be obtained. Thus, the composite substrate 100 illustrated in FIG. 1** can be obtained.

The surface of each layer (specifically, the piezoelectric layer, the first layer, the support substrate, or the second layer) is preferably a flat surface. Specifically, the surface roughness Ra of the surface of each layer is preferably 1 nm or less, more preferably 0.3 nm or less. A method of flattening the surface of each layer is, for example, mirror polishing by chemical-mechanical polishing (CMP). In one embodiment, the surface of each of the first layer 1 and the second layer 2 is subjected to flattening processing before the joining (before the activation treatment).

At the time of the film formation and the joining (contact) described above, the surface of each layer is preferably washed for, for example, removing the residue of a polishing agent, a work-affected layer, or the like. A method for the washing is, for example, wet washing, dry washing, or scrub washing. Of those, the scrub washing is preferred because the surface can be simply and efficiently washed. A specific example of the scrub washing is a method including washing the surface in a scrub washing machine with a detergent (e.g., a SUNWASH series manufactured by Lion Corporation) and then with a solvent (e.g., a mixed solution of acetone and isopropyl alcohol (IPA)).

B. Surface Acoustic Wave Element

A surface acoustic wave element according to an embodiment of the present invention includes the above-mentioned composite substrate. The surface acoustic wave element typically includes the composite substrate and electrodes (interdigital transducers) arranged on the piezoelectric layer side of the composite substrate. Such surface acoustic wave element is suitably used as, for example, a SAW filter in a communication device such as a cellular phone.

EXAMPLES

Now, the present invention is specifically described by way of Examples. However, the present invention is not limited by these Examples.

Example 1

A high-resistance (>2 kΩ·cm) silicon substrate having a diameter of 150 mm and a thickness of 675 μm was prepared.

In addition, a lithium tantalate (LT) substrate having a diameter of 150 mm and a thickness of 350 μm whose front surface and rear surface had been subjected to mirror polishing (such a 42° Y-cut X-propagation LT substrate that the direction in which a surface acoustic wave (SAW) propagated was represented by X, the substrate being a rotated Y-cut plate having a cut-out angle of 42°) was prepared.

A first silicon oxide layer (thickness: 300 nm) was formed on the surface of the silicon substrate, and a second silicon oxide layer (thickness: 300 nm) was formed on the surface of the LT substrate by a RF sputtering method with a boron-doped Si target. In addition, an oxygen gas was introduced as an oxygen source. At that time, the total pressure and oxygen partial pressure of an atmosphere in a chamber were regulated by regulating the amount of the oxygen gas to be introduced. After that, the surface of each of the first silicon oxide layer and the second silicon oxide layer was subjected to chemical-mechanical polishing (CMP) so that its arithmetic average roughness Ra was reduced from 0.6 nm to 0.3 nm. Herein, the arithmetic average roughness Ra is a value measured with an atomic force microscope (AFM) in a field of view measuring 10 μm by 10 μm.

The surface of the silicon substrate (first silicon oxide layer) and the surface of the LT substrate (second silicon oxide layer) were washed. After that, those substrates were introduced into a plasma activation chamber, and the surface of the silicon substrate (first silicon oxide layer) and the surface of the LT substrate (second silicon oxide layer) were activated. Specifically, activation treatment with nitrogen gas plasma (energy: 100 W) was performed at 30° C. for 10 seconds. After that, those substrates were subjected to ultrasonic washing with pure water, and were subjected to spin drying so that particles adhering to their activated surfaces were removed. Next, the alignment of the respective substrates was performed, and the activated surfaces of both the substrates were superimposed on each other at room temperature so that the LT substrate was on an upper side. A situation in which adhesion between the substrates was spread by contact between both the substrates (so-called bonding wave) was observed, and hence it was recognized that the substrates were preliminarily joined in a satisfactory manner.

Next, the resultant joined body was loaded into an oven having a nitrogen atmosphere, and was heated from room temperature to 120° C. at a constant rate of temperature increase of 0.3° C./min. After that, the temperature was further increased to 200° C. at a rate of temperature increase of 0.5° C./min, and was held at the value for 3 hours. After that, electric power supply to a heater was stopped, and the joined body was naturally cooled.

Next, the LT substrate of the joined body was subjected to grinding and lap polishing so that its thickness was set to 10 μm. After that, the thickness was set to 5 μm by CMP, and at the same time, the surface of the substrate was smoothed. Thus, a composite substrate including a piezoelectric layer was obtained.

Example 2

A composite substrate was obtained in the same manner as in Example 1 except that: the gas to be used in the activation treatment was changed to oxygen; and at the time of the heating, the rate of temperature increase to 200° C. was set to 0.3° C./min, and the time period for which the temperature was held at 200° C. was set to 5 hours.

Comparative Example 1

A composite substrate was obtained in the same manner as in Example 1 except that: the gas to be used in the activation treatment was changed to oxygen; and at the time of the heating, the rate of temperature increase was set to 0.8° C./min, and the time period for which the temperature was held at 200° C. was set to 2 hours.

Evaluation

The resultant composite substrates were subjected to the following evaluations. The evaluation results are summarized in Table 1.

1. Recognition of Occurrence of Bubbles

The presence or absence of the occurrence of bubbles was recognized by observing each of the composite substrates from its piezoelectric layer side with a laser microscope (magnification: 200).

2. Measurement of Reflection Characteristic

The reflection characteristic of the resonator of a surface acoustic wave element obtained by forming, on the surface of the piezoelectric layer of each of the composite substrates, interdigital transducers from metallic aluminum under the following conditions was measured with a network analyzer.

Interdigital transducer (IDT) period: 6 μm

IDT opening length: 300 μm

Number of IDTs: 80

Figure 3:
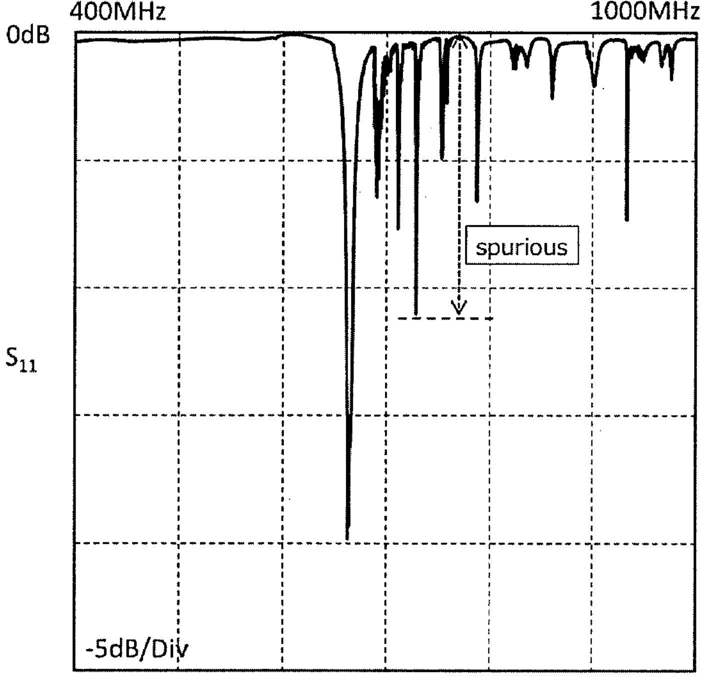
FIG. 3 is a graph for showing the reflection characteristic S11 of Comparative Example 1.

The maximum (dB) of a noise component in a high-frequency region (680 MHz or more) is defined as a spurious, and the measurement results are summarized in Table 1. FIG. 3 is a graph for showing the reflection characteristic S11 of Comparative Example 1.

In addition, the Q-value of the resonator is calculated from the measured reflection coefficient by using the following equation, and its maximum is summarized in Table 1.

$$Q(\omega) = \frac{\omega S_{11} \cdot \text{group\_delay}\ (S_{11})}{1 - |S_{11}|^2}$$

TABLE 1

| | Presence or absence of bubbles | Spurious (dB) | Q (ω) max |
|---|---|---|---|
| Example 1 | Present | 3.5 | 887 |
| Example 2 | Present | 4.3 | 905 |
| Comparative Example 1 | Absent | 12.1 | 720 |

Figure 4:
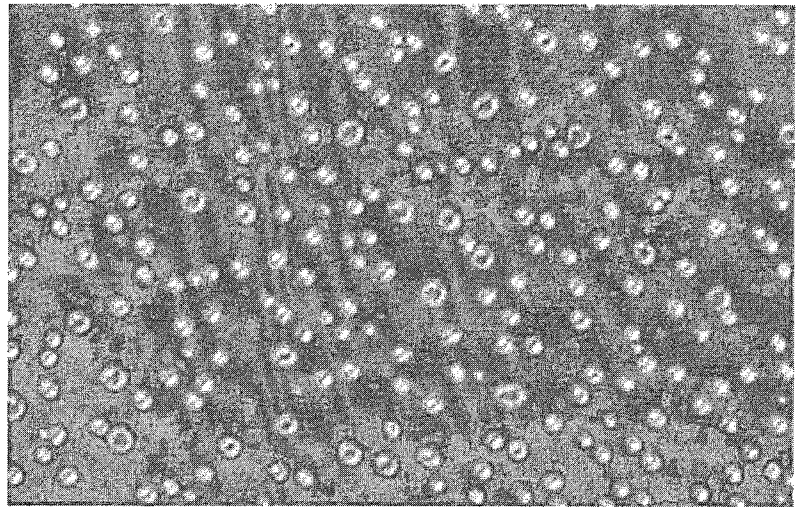
FIG. 4 is an observation photograph of Example 1 with an optical microscope.

As is apparent from FIG. 3, a large spurious can be observed in Comparative Example 1. In each of Examples, as shown in FIG. 4, the occurrence of the bubbles (bubble diameter: from about 20 nm to about 60 nm) can be recognized, and hence the occurrence of a spurious is suppressed.

In Examples, Q-values higher than that of Comparative Example are obtained, and hence the formation of the bubbles can contribute to an improvement in performance.

INDUSTRIAL APPLICABILITY

Typically, the composite substrate according to the embodiment of the present invention may be suitably used in a surface acoustic wave element.

What is claimed is:

1. A composite substrate, comprising in this order:
a support substrate;
an intermediate layer; and
a piezoelectric layer,
wherein the intermediate layer contains bubbles,
wherein the bubbles each have a bubble diameter of from 10 nm to 100 nm, and the bubble diameter is a long diameter of each of the bubbles, and
wherein the intermediate layer has a piezoelectric layer facing region in which the bubbles are absent, and the piezoelectric layer facing region is formed in the entirety of a range of 200 nm or less from an interface between the intermediate layer and the piezoelectric layer.

2. The composite substrate according to claim 1, wherein the intermediate layer contains silicon oxide.

3. The composite substrate according to claim 1, wherein the intermediate layer has a thickness of 500 nm or more and 1,000 nm or less.

4. The composite substrate according to claim 1, wherein the intermediate layer has a support substrate facing region in which the bubbles are absent, and the support substrate facing region is formed in a range of 200 nm or less from an interface between the intermediate layer and the support substrate.

5. The composite substrate according to claim 1, wherein the piezoelectric layer has a thickness of 5 μm or less.

6. A method of producing a composite substrate, comprising:
forming a first layer on one side of a support substrate;
forming a second layer on one side of a piezoelectric substrate;
joining the first layer and the second layer to provide a joined layer; and
forming bubbles in the joined layer to provide an intermediate layer;
wherein the bubbles each have a bubble diameter of from 10 nm to 100 nm, and the bubble diameter is a long diameter of each of the bubbles, and
wherein the intermediate layer has a piezoelectric substrate facing region in which the bubbles are absent, and the piezoelectric substrate facing region is formed in the entirety of a range of 200 nm or less from an interface between the intermediate layer and the piezoelectric substrate.

7. The production method according to claim 6, wherein at a time of the joining, a joining surface of the first layer and a joining surface of the second layer are subjected to activation treatment.

8. The production method according to claim 7, wherein the joining surfaces are hydrophilized by the activation treatment.

9. The production method according to claim 7, wherein the activation treatment is performed by plasma irradiation.

10. The production method according to claim 6, wherein the forming the bubbles is performed by heating the joined layer.

11. The production method according to claim 10, wherein the heating includes heating the joined layer at a rate of temperature increase of 0.7° C./min or less until a heating temperature reaches from 100° C. to 150° C.

12. The production method according to claim 10, wherein the heating includes heating the joined layer at 180° C. or more.

* * * * *